(12) United States Patent
Kang et al.

(10) Patent No.: US 7,396,761 B2
(45) Date of Patent: Jul. 8, 2008

(54) SEMICONDUCTOR DEVICE AND METHOD OF MANUFACTURING THE SAME

(75) Inventors: Sung-Kwan Kang, Seoul (KR); Jong-Wook Lee, Yongin-si (KR); Yong-Hoon Son, Yongin-si (KR); Yu-Gyun Shin, Seongnam-si (KR); Jun-Ho Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 35 days.

(21) Appl. No.: 11/605,092

(22) Filed: Nov. 28, 2006

(65) Prior Publication Data

US 2007/0123062 A1 May 31, 2007

(30) Foreign Application Priority Data

Nov. 29, 2005 (KR) ............... 10-2005-0114476

(51) Int. Cl.
*H01L 21/336* (2006.01)
*H01L 21/4763* (2006.01)
*H01L 21/44* (2006.01)

(52) U.S. Cl. ............... 438/629; 438/301; 438/795; 438/675; 438/638; 257/314; 257/E21.442; 257/E21.134; 257/E21.579

(58) Field of Classification Search ........... 438/301, 438/629, 638, 675, 795; 257/314, E21.442, 257/E21.134, E21.579
See application file for complete search history.

(56) References Cited

U.S. PATENT DOCUMENTS

| 6,060,392 | A | 5/2000 | Essaian et al. |
| 6,096,622 | A | 8/2000 | Kim et al. |
| 2004/0023449 | A1* | 2/2004 | Hsu et al. .......... 438/152 |
| 2007/0132022 | A1* | 6/2007 | Son et al. .......... 257/347 |

FOREIGN PATENT DOCUMENTS

| JP | 59-194445 | 11/1984 |
| JP | 1-264214 | 10/1989 |
| KR | 10-0275600 | 9/2000 |

* cited by examiner

*Primary Examiner*—Michael S. Lebentritt
*Assistant Examiner*—Mohsen Ahmadi
(74) *Attorney, Agent, or Firm*—Mills & Onello LLP

(57) ABSTRACT

In a semiconductor device and a method of manufacturing the semiconductor device, a plug and a channel structure are formed. The plug fills an opening and the channel structure extends upwardly from the plug. The channel structure has a substantially vertical sidewall. The opening is formed through an insulation structure located on a substrate. The plug and the channel structure comprise a material in a single crystalline state that is changed from an amorphous state by an irradiation of a laser beam. The channel structure is doped with impurities such as boron, phosphorus or arsenic.

15 Claims, 3 Drawing Sheets

SEMICONDUCTOR DEVICE AND METHOD OF MANUFACTURING THE SAME

CROSS-REFERENCE TO RELATED APPLICATION

This application claims priority under 35 U.S.C. § 119 to Korean Patent Application No. 10-2005-0114476 filed on Nov. 29, 2005, the contents of which are incorporated by reference in their entirety.

BACKGROUND OF THE INVENTION

1. Field of the Invention

Example embodiments of the present invention relate to a semiconductor device and a method of manufacturing the semiconductor device. More particularly, example embodiments of the present invention relate to a semiconductor device including a fin-type channel structure having a substantially vertical sidewall and a method of manufacturing the semiconductor device.

2. Description of the Related Art

In semiconductor devices, the area occupied by a gate pattern continues to be reduced with increased integration of such devices. However, as the gate pattern area is reduced, the length of a channel region is likewise reduced, thereby deteriorating the electrical reliability of the devices due to the short channel effect.

Therefore, a continuous goal of research in this field is to provide semiconductor devices with sufficient channel region length. Particularly, a fabrication method by which a recess is formed in the substrate for increasing channel length has been actively explored. Recently, a fabrication method in which a fin-type channel structure extending upwardly from the substrate has been disclosed in effort to achieve sufficient channel region length. Here, the fin-type channel structure prevents the short channel effect more efficiently because the channel region is formed at three sides of the fin-type channel structure.

It is desired that the fin-type channel structure has a substantially vertical sidewall. However, a conventional fin-type channel structure formed by a conventional method has sidewalls that are tapered and become narrower in upper portions of the sidewalls. That is, the sidewalls of the conventional fin-type channel structure have a substantially trapezoid profile, which makes it difficult to dope impurities into the conventional fin-type channel structure.

Further, in accordance with the conventional method, a substrate is etched to form the conventional fin-type channel structure, which can cause damage to the substrate.

SUMMARY OF THE INVENTION

Example embodiments of the present invention provide a semiconductor device with a fin-type channel structure having substantially vertical sidewalls and wherein damage to the substrate is reduced.

Example embodiments of the present invention further provide a method of manufacturing a semiconductor device with a fin-type channel structure having substantially vertical sidewalls and wherein damage to the substrate is reduced.

In one aspect, a semiconductor device comprises: a substrate having a single crystalline state; an insulation structure formed on the substrate, the insulation structure having an opening that partially exposes the substrate; a plug formed in the opening, the plug including a material in a single crystalline state that is transformed from an amorphous state by an irradiation of a laser beam; and a channel structure extending upwardly from the plug, the channel structure having a substantially vertical sidewall, the channel structure including a material in a single crystalline state that is transformed from an amorphous state by the irradiation of the laser beam.

In one embodiment, the substrate comprises at least one selected from the group consisting of silicon and germanium.

In another embodiment, the insulation structure comprises at least one selected from the group consisting of an oxide pattern and a nitride pattern.

In another embodiment, the channel structure is doped with an impurity comprising any one selected from the group consisting of boron, phosphorus and arsenic.

In another aspect, a method of manufacturing a semiconductor device comprises: forming a preliminary insulation structure having an opening that partially exposes a substrate, the preliminary insulation structure including at least two patterns of materials that have etching selectivities with respect to one another; forming an amorphous material structure on the substrate that fills the opening; transforming the amorphous material structure into a single crystalline material structure by irradiating a laser beam onto the amorphous material structure; and exposing an upper portion of the single crystalline material structure by removing an uppermost pattern of the preliminary insulation structure to provide an insulation structure, the upper portion of the single crystalline material structure being a channel structure having a substantially vertical sidewall.

In one embodiment, the substrate comprises at least one selected from the group consisting of silicon and germanium.

In another embodiment, the preliminary insulation structure comprises a first insulating pattern, a second insulating pattern and a third insulating pattern that are successively formed.

In another embodiment, the first and the third insulating patterns comprise oxide and the second insulating pattern comprises nitride.

In another embodiment, the opening of the preliminary insulation structure is formed by an anisotropic etching process such that the opening has a substantially vertical sidewall.

In another embodiment, the amorphous material structure is formed by a selective epitaxial growth process.

In another embodiment, the amorphous material structure comprises at least one selected from the group consisting of silicon and germanium.

In another embodiment, the amorphous material structure comprises an impurity.

In another embodiment, the impurity comprises any one selected from the group consisting of boron, phosphorus and arsenic.

In another embodiment, the impurity is doped into the amorphous material structure by a diffusion process while the amorphous material structure is formed.

In another embodiment, the impurity is doped into the amorphous material structure by an ion implantation process after the amorphous material structure is formed.

In another embodiment, the laser beam irradiated onto the amorphous material structure heats the amorphous material structure to a temperature that is a substantial melting point of the amorphous structure.

In another embodiment, following removal of the laser beam irradiation, the amorphous material structure, in a molten state, re-solidifies during cooling, to be transformed into the single-crystalline material structure using the substrate as a seed for crystallization.

In another embodiment, the substrate comprises a single-crystal material in a single-crystalline state.

In another embodiment, forming the amorphous material structure comprises: forming a preliminary amorphous material structure on the substrate and the preliminary insulation structure to fill the opening; and performing a planarizing process on the preliminary amorphous material structure until the preliminary insulation structure is exposed to form the amorphous material structure confined in the opening.

According to embodiments of the present invention, a fin-type channel structure having a substantially vertical sidewall is formed on a substrate. Because the fin-type channel structure is formed without etching the substrate, deterioration of the substrate, which causes a decrease of the electric reliability of the resulting device, is prevented. An insulation structure formed by removing an upper portion of a preliminary insulation structure can be used to isolate the fin-type channel structure. Thus, processes for forming a conventional isolating layer are not required.

BRIEF DESCRIPTION OF THE DRAWINGS

The above and other features and advantages of the present invention will become more apparent by describing in detail embodiments thereof with reference to the accompanying drawings, in which.

DETAILED DESCRIPTION OF EMBODIMENTS

Figure 1:
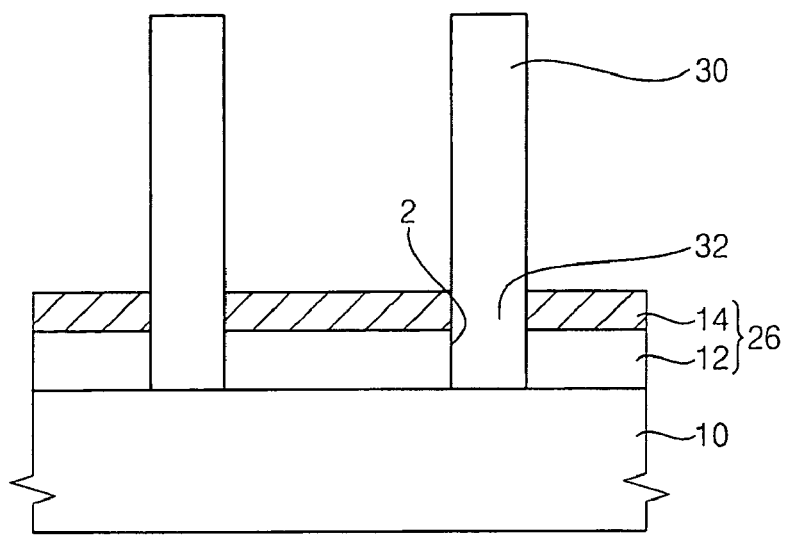
FIG. 1 is a cross-sectional view illustrating a semiconductor device having a fin-type channel structure in accordance with an embodiment of the present invention.

Embodiments of the present invention will be described with reference to the accompanying drawings. The present invention may, however, be embodied in many different forms and should not be construed as limited to the embodiments set forth herein. Rather, the embodiments are provided so that disclosure of the present invention will be thorough and complete. The principles and features of this invention may be employed in varied and numerous embodiments without departing from the scope of the present invention. In the drawings, the size and relative sizes of layers and regions may be exaggerated for clarity. The drawings are not necessarily to scale. Like reference numerals designate like elements throughout the drawings.

It will also be understood that when an element or layer is referred to as being "on," "connected to" and/or "coupled to" another element or layer, the element or layer may be directly on, connected and/or coupled to the other element or layer or intervening elements or layers may be present. In contrast, when an element is referred to as being "directly on," "directly connected to" and/or "directly coupled to" another element or layer, no intervening elements or layers are present. As used herein, the term "and/or" may include any and all combinations of one or more of the associated listed items.

It will also be understood that, although the terms first, second, etc. may be used herein to describe various elements, components, regions, layers and/or sections. These elements, components, regions, layers and/or sections are not limited by these terms. These terms may be used to distinguish one element, component, region, layer and/or section from another element, component, region, layer and/or section. For example, a first element, component, region, layer and/or section discussed below could be termed a second element, component, region, layer and/or section without departing from the teachings of the present invention.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

The terminology used herein is for the purpose of describing particular embodiments only and is not intended to be limiting of the invention. As used herein, the singular terms "a," "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence and/or addition of one or more other features, integers, steps, operations, elements, components, and/or groups thereof.

Unless otherwise defined, all terms (including technical and scientific terms) used herein may have the same meaning as what is commonly understood by one of ordinary skill in the art. It will be further understood that terms, such as those defined in commonly used dictionaries, should be interpreted as having a meaning that is consistent with their meaning in the context of this specification and the relevant art and will not be interpreted in an idealized and/or overly formal sense unless expressly so defined herein.

Embodiments of the present invention are described with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated as a rectangle will, typically, have rounded or curved features. Thus, the regions illustrated in the figures are schematic in nature of a device and are not intended to limit the scope of the present invention.

FIG. 1 is a cross-sectional view illustrating a semiconductor device having a fin-type channel structure in accordance with an example embodiment of the present invention.

Referring to FIG. 1, the semiconductor device includes a substrate 10 and an insulation structure 26 formed on the substrate 10. The substrate 10 includes a material in a single crystalline state. An opening 2 is formed through the insulation structure 26. The substrate 10 is partially exposed by the opening 2. The semiconductor device includes a plug 32 that fills the opening 2. The semiconductor device includes a channel structure 30 extending upwardly from the plug 32. The channel structure 30 is a fin-type channel structure having a substantially vertical sidewall.

The substrate 10 may include a semiconductor material. Particularly, the substrate 10 may include silicon, germanium, etc. These may be used alone or in a mixture thereof.

The insulation structure 26 may be a single-layered structure or a multi-layered structure. In a case where the insulation structure 26 is a single-layered structure, the insulation structure 26 may include an oxide layer pattern or a nitride layer pattern. In a case where the insulation structure 26 is a multi-layered structure, the insulation structure 26 may include at least two materials that have etching selectivities relative to one another. In this case, the insulation structure 26 may include a first insulating pattern 12 and a second insulating pattern 14 formed on the first insulating pattern 12. In one example, the first insulating pattern 12 and the second insulating pattern 14 include an oxide and a nitride, respectively. In another example, the first insulating pattern 12 and the second insulating pattern 14 include a nitride and an oxide, respectively. The opening 2 of the insulation structure 26 may be formed in one embodiment using a photolithography process.

In an example embodiment, the plug 32 may include a material in a single crystalline state that has been changed, or transformed, from a previous amorphous state. In this embodiment, an amorphous material structure having a substantially vertical sidewall is initially formed. The amorphous structure has a lower portion that fills the opening 2. The amorphous structure is then subject to radiation by a laser beam to cause the lower portion of the amorphous structure to be transformed into the plug 32 having the single crystalline state.

A channel structure 30 extends upwardly from the plug 32. The channel structure 30 and the plug 32 may be formed as one body, or optionally can be formed as multiple bodies that are joined. Like the plug 32, the channel structure 30 may include a material in a single crystalline state that has been transformed from an amorphous state. An upper portion of the amorphous structure is exposed to irradiation by the laser beam so that the upper portion of the amorphous structure can be transformed into the channel structure 30 having the single crystalline state. The channel structure 30 can be doped with impurities. The impurities may include, for example, boron, phosphorus or arsenic. Preferably, these impurities are used alone. The doping process used to dope the impurities into the channel structure 30 can include a diffusion process, an ion implantation process, and other suitable doping processes. The impurities may optionally be doped into the channel structure 30 by in-situ doping. Particularly, an impurity gas including the impurities may be provided while the amorphous structure is formed.

The channel structure 30 is a fin-type channel structure that has substantially vertical sidewalls. This is because the shape of an opening 1 formed through a preliminary insulation structure 20 (See FIG. 2B) defines the shape of the channel structure 30, and that opening has substantially vertical inner sidewalls.

FIGS. 2A to 2E are cross-sectional views illustrating a method of manufacturing the semiconductor device of FIG. 1.

Figure 2A:
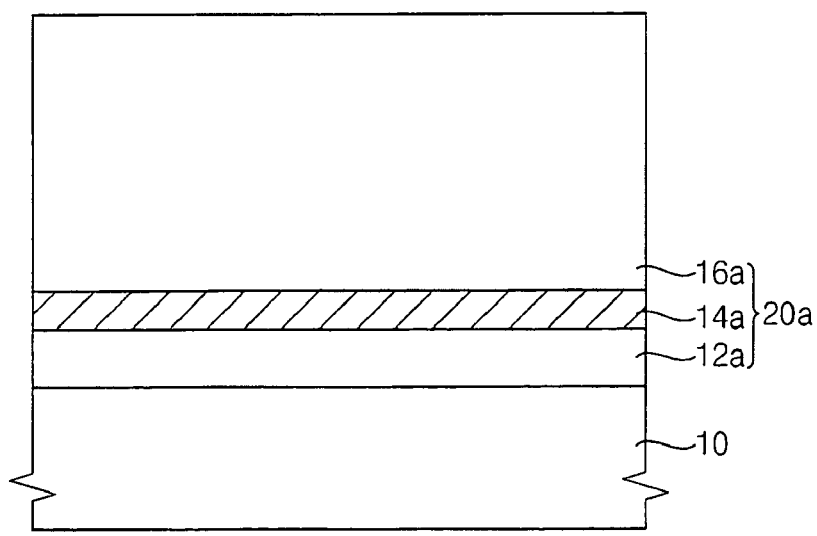
FIGS. 2A to 2E are cross-sectional views illustrating a method of manufacturing a semiconductor device in accordance with an embodiment of the present invention.

Referring to FIG. 2A, a substrate 10 having a single crystalline state is prepared. The substrate 10 may include silicon, germanium, and other suitable single-crystal substrate materials. These materials may be used alone or in a mixture thereof.

An insulation structure 20a is formed on the substrate 10. The insulation structure 20a may include at least two layers having etching selectivities with respect to one another. For example, the insulation structure 20a includes a first insulation layer 12a, a second insulation layer 14a and a third insulation layer 16a that are successively formed on the substrate 10. The first insulation layer 12a and the third insulation layer 16a may be formed using the same material. The second insulation layer 14a may include a material that is substantially different from those included in the first and the third insulation layers 12a and 16a such that the second insulation layer 14a has an etch rate that is substantially different from those of the first and the third insulation layers 12a and 16a. For example, in a case where the first and the third insulation layers 12a and 16a include oxide, the second insulating layer 14a may include nitride.

The thickness of the third insulation layer 16a may be determined by considering the desired height of a fin-type channel structure that is to be formed in subsequent processes. This is because the height of the fin-type channel structure is determined by the thickness of the third insulating layer 16a.

Figure 2B:
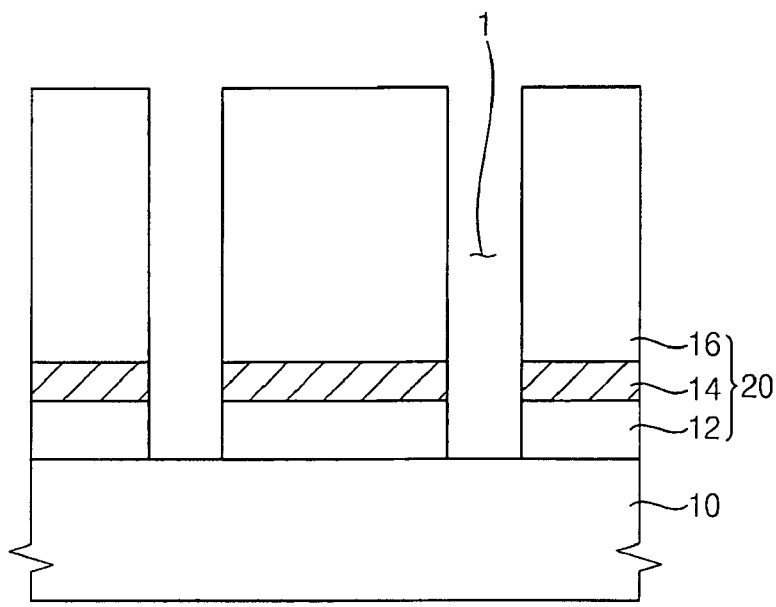

Referring to FIG. 2B, the insulation structure 20a is etched to form a preliminary insulation structure 20 having an opening 1, which partially exposes the substrate 10. A photolithography process may be employed for etching the insulation structure 20a. A photoresist pattern or a hardmask pattern may be used in the photolithography process. The opening 1 can be formed by an anisotropic etching process so that the opening 1 has substantially vertical inner sidewalls. This, in turn, allows an amorphous structure 22a (see FIG. 2C) formed of amorphous material that later fills the opening 1 to have substantially vertical sidewalls. Because the insulation structure 20a includes the first insulation layer 12a, the second insulation layer 14a and the third insulation layer 16a, the preliminary insulation structure 20 may include a first insulating pattern 12, a second insulating pattern 14 and a third insulating pattern 16.

Figure 2C:
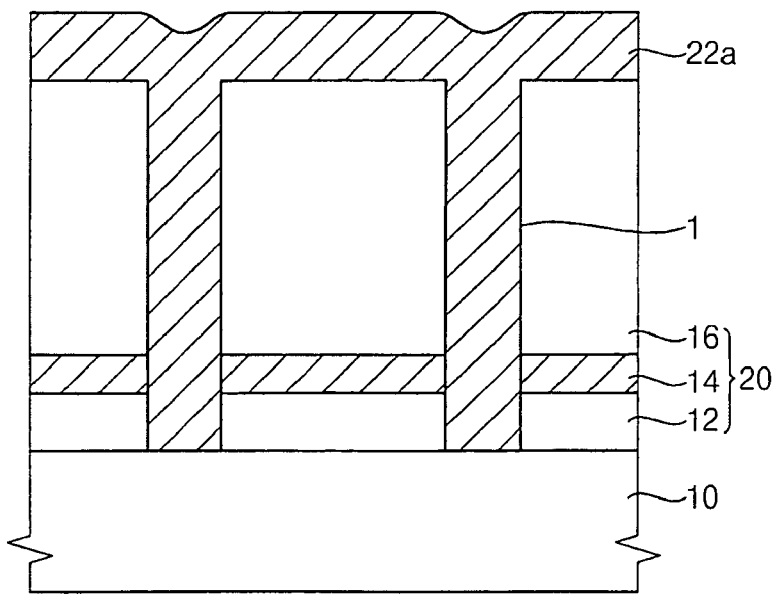

Referring to FIG. 2C, the amorphous structure 22a is formed by a selective epitaxial growth (SEG) process. The amorphous structure 22a fills the opening 1 of the preliminary insulation structure 20. The amorphous structure 22a is formed for example, of an amorphous material including, for example, silicon, germanium or silicon-germanium. In a case where the amorphous structure 22a includes silicon, the source gas used to form the amorphous structure 22a may include silane ($SiH_4$), disilane ($Si_2H_4$), and other suitable silicon-based gases. In a case where the amorphous structure 22a includes germanium, the source gas used to form the amorphous structure 22a may include germain ($GeH_4$), and other suitable germanium-based gases.

During the SEG process, the amorphous structure 22a can optionally be doped with impurities. That is, the amorphous structure 22a can be doped with impurities in an in-situ doping process. In the case where the amorphous structure 22a is doped with the impurities in an in-situ doping process, an impurity gas is supplied into the process chamber together with the source gas while the SEG process is performed. In a case where the amorphous structure 22a is doped with phosphorus, the impurity gas can include phosphine ($PH_3$), for example. In a case where the amorphous structure 22a is doped with boron, the impurity gas can include diborane ($B_2H_6$), for example.

When the amorphous structure 22a is formed by the SEG process, the amorphous structure 22a may cover the surface of the preliminary insulation structure 20. However, it is desired that the amorphous structure 22a be confined to only in the opening 1 of the preliminary insulation structure 20. Therefore, a planarizing process such as a chemical mechanical polishing (CMP) process, etch back process, etc., is performed to remove a portion of the amorphous structure 22a located above the surface of the preliminary insulation structure 20. The planarizing process is performed until the preliminary insulation structure 20 is exposed.

Figure 2D:
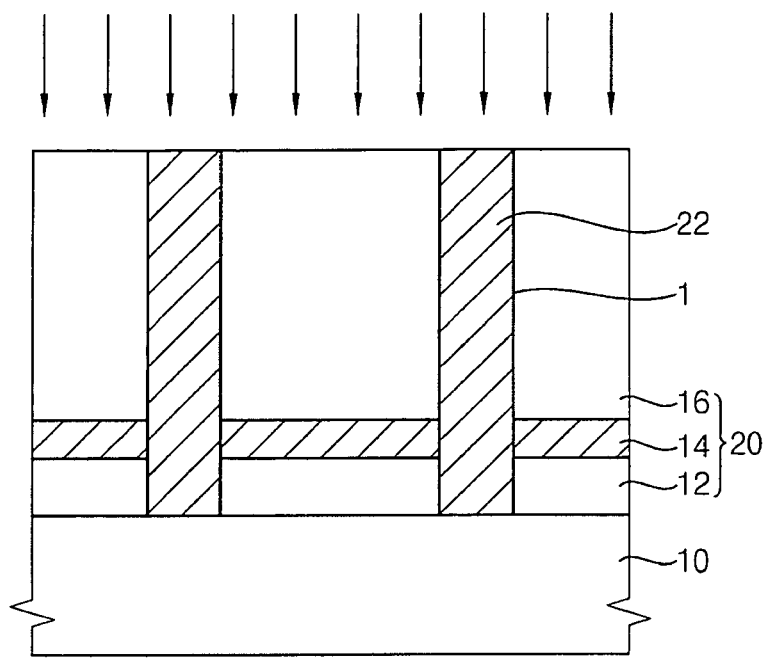

As illustrated in FIG. 2D, the planarizing process is performed to remove the portion of the amorphous structure 22a located above the surface of the preliminary insulation structure 20. In this manner, the amorphous structure 22 is confined to the opening 1 of the preliminary insulation structure 20.

Figure 2E:
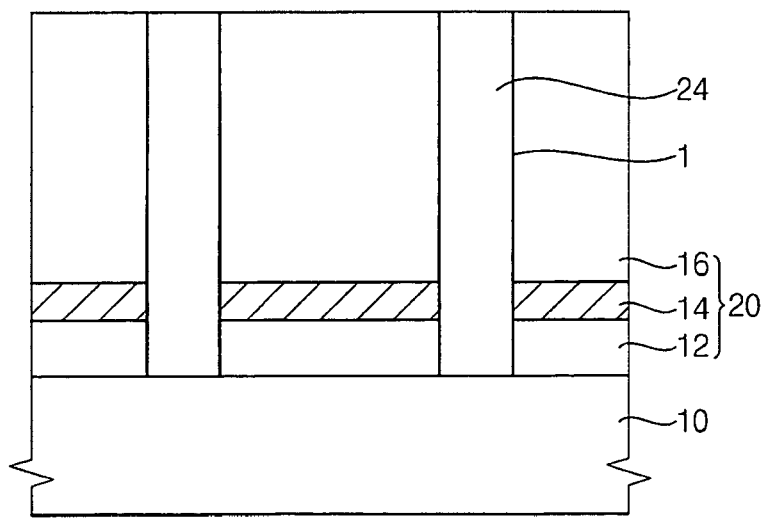

Referring to FIGS. 2D and 2E, a process required for changing the state of the amorphous structure 22 from an amorphous state into a single-crystalline state is performed. Particularly, a laser beam is irradiated onto the amorphous structure 22 to change the amorphous state of the amorphous structure 22 into the single-crystalline state. When the laser beam is irradiated onto the amorphous structure 22, the amorphous structure 22 may melt. Thus, a solid phase of the amorphous structure 22 is changed into a liquid phase. A phase change occurs from an upper face of the amorphous structure 22 to a lower face of the amorphous structure 22. The lower face of the amorphous structure 22 is in contact with the substrate 10, which is a single-crystal material. Here, the phase change may also occur in the amorphous structure at its lower face at the point of contact with the surface of the single-crystal substrate.

As described above, the laser beam irradiated onto the amorphous structure 22 changes the solid phase of the amorphous structure 22 into the liquid phase. The substrate 10 having the single crystalline state serves as a seed while the amorphous structure 22 having the liquid phase is re-solidified during cooling, following removal of the laser radiation. Therefore, the amorphous state of the amorphous structure 22 is changed into the single crystalline state. That is, the amorphous structure 22 is crystallized. Because it only requires a few nano seconds to crystallize the amorphous structure 22, the amorphous structure 22 will not flow from the substrate 10 even when the amorphous structure 22 is in the liquid phase.

In a case where the laser beam is irradiated onto the amorphous structure 22, the amorphous structure 22 is heated to a temperature at which the amorphous structure 22 melts. Particularly, in a case where the amorphous structure 22 includes silicon, the amorphous structure 22 can be heated by the laser beam up to a temperature of about 1,410° C., which is substantially the same as the melting point of silicon. In a case where the amorphous structure 22 includes germanium, the amorphous structure 22 may be heated by the laser beam up to a temperature of about 937.4° C., which is substantially the same as the melting point of germanium.

A member for irradiating the laser beam may employ an excimer laser beam. The excimer laser beam is a type of gaseous laser beam. The member may scan the amorphous structure 22 with the excimer laser beam so that the time required for irradiating the excimer laser beam may be decreased.

The substrate 10 may be also heated while the laser beam is irradiated. In a case where that the substrate 10 is heated together with the amorphous structure 22, the temperature gradient of the amorphous structure 22 is decreased while the amorphous state of the amorphous structure 22 is changed into the single crystalline state. For example, when the laser beam is irradiated, the substrate 10 can be heated to about 400° C. to decrease the temperature gradient in the amorphous structure 22.

As illustrated in FIG. 2E, the laser beam irradiated onto the amorphous structure 22 causes the amorphous structure 22 to transform into a single crystalline structure 24. That is, the laser beam irradiated onto the amorphous structure 22 causes the amorphous state of the amorphous structure 22 to change into a single crystalline state.

An upper portion of the preliminary insulation structure 20 is removed to form an insulation structure 26 having an opening 2, as shown in FIG. 1. For example, the third insulating pattern 16 is removed from the preliminary insulation structure 20. As illustrated in FIG. 1, the plug 32 filling the opening 2 of the insulation structure 26 corresponds to a lower portion of the single crystalline structure 24. The fin-type channel structure 30 connected to the plug 32 corresponds to an upper portion of the crystalline structure 24. The fin-type channel structure 30 is located above the insulation structure 26. The insulation structure 26 operates to isolate neighboring fin-type channel structures 30.

As described above, the opening 1 is formed using an anisotropic etching process so that sidewalls of the opening 1 are substantially vertical. Because the fin-type channel structure 30 is formed in the opening 1, the fin-type channel structure 30 likewise has substantially vertical sidewalls.

In a case where the impurities are not doped while the amorphous structure 22a formed, impurities may be doped into the fin-type channel structure 30 following formation of the fin-type channel structure 30 having the substantially vertical sidewalls.

According to the present invention, a fin-type channel structure having a substantially vertical sidewall is formed on a substrate. Because the fin-type channel structure is formed without etching the substrate, deterioration of the substrate, which can cause a decrease in electric reliability, can be prevented. An insulation structure formed by removing an upper portion of a preliminary insulation structure operates to isolate neighboring fin-type channel structures. Thus, processes for forming a conventional isolating layer are not required.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the embodiments of the present invention disclosed herein. Accordingly, all such modifications are intended to be included within the scope of the present invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method of manufacturing a semiconductor device, the method comprising:

forming a preliminary insulation structure having an opening that partially exposes a substrate, the preliminary insulation structure including at least two patterns of materials that have etching selectivities with respect to one another;

forming an amorphous material structure on the substrate that fills the opening, wherein forming the amorphous material structure comprises:

forming a preliminary amorphous material structure on the substrate and the preliminary insulation structure to fill the opening;

performing a planarizing process on the preliminary amorphous material structure until the preliminary insulation structure is exposed to form the amorphous material structure confined in the opening;

transforming the amorphous material structure into a single crystalline material structure by irradiating a laser beam onto the amorphous material structure; and exposing an upper portion of the single crystalline material structure by removing an uppermost pattern of the preliminary insulation structure to provide an insulation structure, the upper portion of the single crystalline material structure being a channel structure having a substantially vertical sidewall.

2. The method of claim 1, wherein the substrate comprises at least one selected from the group consisting of silicon and germanium.

3. The method of claim 1, wherein the preliminary insulation structure comprises a first insulating pattern, a second insulating pattern and a third insulating pattern that are successively formed.

4. The method of claim 3, wherein the first and the third insulating patterns comprise oxide and the second insulating pattern comprises nitride.

5. The method of claim 1, wherein the opening of the preliminary insulation structure is formed by an anisotropic etching process such that the opening has a substantially vertical sidewall.

6. The method of claim 1, wherein the amorphous material structure is formed by a selective epitaxial growth process.

7. The method of claim 1, wherein the amorphous material structure comprises at least one selected from the group consisting of silicon and germanium.

8. The method of claim 1, wherein the amorphous material structure comprises an impurity.

9. The method of claim 8, wherein the impurity comprises any one selected from the group consisting of boron, phosphorus and arsenic.

10. The method of claim 8, wherein the impurity is doped into the amorphous material structure by a diffusion process while the amorphous material structure is formed.

11. The method of claim 8, wherein the impurity is doped into the amorphous material structure by an ion implantation process after the amorphous material structure is formed.

12. The method of claim 1, wherein the laser beam irradiated onto the amorphous material structure heats the amorphous material structure to a temperature that is a substantial melting point of the amorphous material structure.

13. The method of claim 12 wherein, following removal of the laser beam irradiation, the amorphous material structure, in a molten state, re-solidifies during cooling, to be transformed into the single-crystalline material structure using the substrate as a seed for crystallization.

14. The method of claim 13 wherein the substrate comprises a single-crystal material in a single-crystalline state.

15. The method of claim 1 wherein the substrate comprises a single-crystal material in a single-crystalline state.

* * * * *